US012136537B2

United States Patent
Guo et al.

(10) Patent No.: US 12,136,537 B2
(45) Date of Patent: Nov. 5, 2024

(54) COST EFFECTIVE RADIO FREQUENCY IMPEDANCE MATCHING NETWORKS

(71) Applicant: Applied Materials, Inc., Santa Clara, CA (US)

(72) Inventors: Yue Guo, Redwood City, CA (US); Kartik Ramaswamy, San Jose, CA (US); Farhad Moghadam, Saratoga, CA (US); Yang Yang, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 112 days.

(21) Appl. No.: 17/963,146

(22) Filed: Oct. 10, 2022

(65) Prior Publication Data

US 2024/0120178 A1 Apr. 11, 2024

(51) Int. Cl.
*H01J 37/32* (2006.01)
*H03H 7/40* (2006.01)

(52) U.S. Cl.
CPC ......... *H01J 37/32183* (2013.01); *H03H 7/40* (2013.01); *H01J 37/32091* (2013.01); *H01J 37/321* (2013.01)

(58) Field of Classification Search
CPC ........... H01J 37/32183; H01J 37/32091; H01J 37/321; H03H 7/40
See application file for complete search history.

(56) References Cited

U.S. PATENT DOCUMENTS

| 2015/0069912 A1* | 3/2015 | Valcore, Jr. ............... H03J 7/00 |
| | | 315/111.21 |
| 2020/0126762 A1 | 4/2020 | Yang et al. |
| 2020/0286720 A1 | 9/2020 | van Greunen et al. |

(Continued)

FOREIGN PATENT DOCUMENTS

| CN | 107153722 A * | 9/2017 | ............. G01R 17/00 |
| CN | 107154787 A * | 9/2017 | ............. G06F 17/11 |

(Continued)

OTHER PUBLICATIONS

PCT/US2022/054317, International Search Report and Written Opinion dated Jul. 4, 2023, 10 pages.

*Primary Examiner* — Abdullah A Riyami
*Assistant Examiner* — Syed M Kaiser
(74) *Attorney, Agent, or Firm* — Patterson + Sheridan, LLP

(57) ABSTRACT

Embodiments provided herein generally include apparatus and methods in a plasma processing system for rapid and inexpensive repair and replacement of RF sensors necessary for the operation of radio frequency (RF) power generation and impedance matching equipment used for generating a plasma in a plasma chamber during semiconductor processing therein. Flexible communications between equipment of the plasma processing system allows sharing of process information and equipment settings for batch processing of a plurality of semiconductor wafers during the manufacturing process. Operational settings of a master plasma processing system may be used to control the operation of a (Continued)

plurality of slave processing systems. In addition, the operational settings of the master plasma processing system may be recorded and reused for controlling the plurality of slave processing systems.

20 Claims, 10 Drawing Sheets

(56) References Cited

U.S. PATENT DOCUMENTS

| | | | |
|---|---|---|---|
| 2020/0411288 A1* | 12/2020 | Wang | H01J 37/32935 |
| 2021/0217590 A1* | 7/2021 | Savas | H01J 37/32183 |
| 2021/0217593 A1* | 7/2021 | Savas | H01J 37/32577 |

FOREIGN PATENT DOCUMENTS

| | | | | |
|---|---|---|---|---|
| JP | 2011182046 A | | 9/2011 | |
| WO | WO-2020081827 A1 | * | 4/2020 | ........ H01J 37/32183 |

* cited by examiner

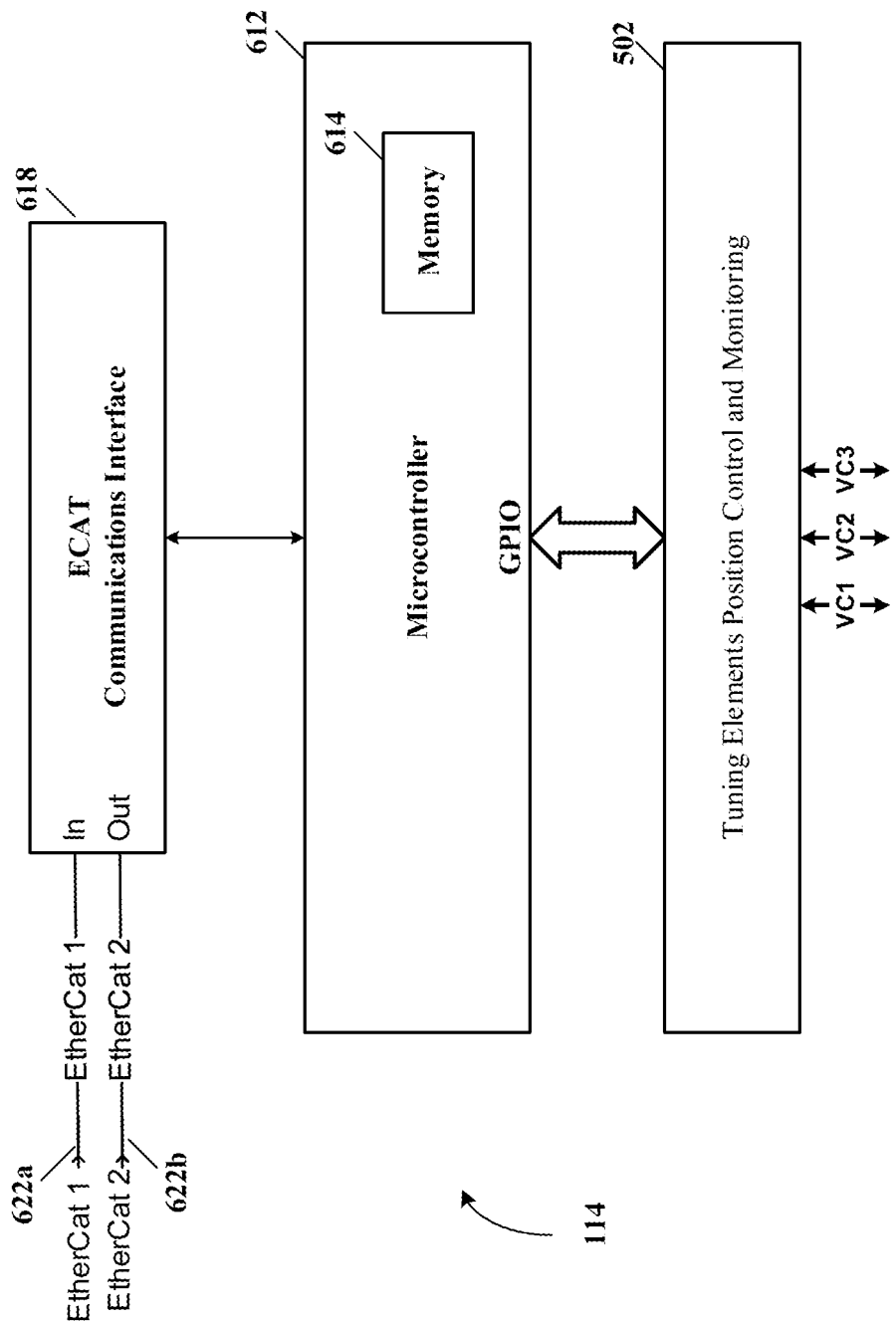

COST EFFECTIVE RADIO FREQUENCY IMPEDANCE MATCHING NETWORKS

BACKGROUND

Field

Embodiments of the present disclosure generally relate to high-power radio frequency (RF) power sources and impedance matching networks adapted for generating a plasma in a semiconductor processing reactor chamber, and, in particular, to cost effective RF impedance matching networks and associated subassemblies thereof.

Description of the Related Art

In a plasma reactor chamber an RF power source provides RF power to the plasma reactor chamber for generating plasma therein, via an impedance matching network coupled between the RF power source and the plasma reactor chamber. The RF impedance of a plasma is a complex and highly variable function of many process parameters and conditions. The impedance matching network maximizes power transfer from the RF power source to the plasma in the reactor chamber. This is accomplished when the output impedance of the impedance matching network is equal to the complex conjugate of the input impedance of the plasma in the reactor chamber. The impedance matching network transforms the impedance of the plasma in the reactor chamber to the characteristic operating output impedance of the RF power source, e.g., 50 ohms, for optimal RF power transfer therefrom.

The RF impedance matching network is an electrical circuit disposed between the RF power source and the plasma reactor to optimize RF power transfer efficiency. To optimize RF power transfer, it is important for the RF impedance matching network to tune at a desired frequency to a desired complex impedance accurately. This is important for providing reliable, efficient, and predictable plasma process results. In order to ensure operational accuracy, the RF impedance matching network depends on the accuracy of associated RF sensors, e.g., RF voltage, RF current and RF power sensors which are used for providing real-time plasma processing conditions, e.g., plasma chamber impedances and RF power being delivered to the plasma chamber during semiconductor manufacturing process operation. However, maintaining plasma chamber RF sensor operation and accuracy can be very time consuming, labor intensive and result in costly semiconductor process downtime.

Hence, there is a need for less costly and faster repair, calibration and/or replacement of RF sensors so as to maintain more operational time of the RF source and RF impedance matching network and thus increased plasma chamber processing utilization.

SUMMARY

Embodiments of the disclosure include a radio frequency (RF) impedance matching unit adapted for coupling between an RF power generator and a plasma processing chamber. The RF impedance matching unit includes an RF tuning circuit having a first node adapted for coupling to an RF power generator, a second node adapted for coupling to a plasma processing chamber, and adjustable tuning elements for transforming an output resistance of the RF power generator into a plurality of impedances at the second node. The RF impedance matching unit further includes a match controller coupled to the adjustable tuning elements of the RF tuning circuit, wherein the match controller controls and monitors positions of the adjustable tuning elements of the RF tuning circuit; and a communications interface coupled to the match controller for receiving position information for and transmitting position information of the adjustable tuning elements of the RF tuning circuit.

Embodiments of the disclosure include a system for controlling and monitoring a radio frequency (RF) power generator and impedance matching unit adapted for generating a plasma in a plasma processing chamber. The RF power generator has an RF output and is coupled to a first communications interface for monitoring and control thereof. An RF power measurement module is coupled to the output of the RF power generator, and measures forward and reflected RF power at the output thereof, and calculates standing wave ratio (SWR) from the measured forward and reflected RF power, a second communications interface is coupled to the RF power measurement module for transmitting the measured forward and reflected RF power and calculated SWR. An RF tuning circuit has a first node coupled to the RF power measurement module, and adjustable tuning elements for transforming an output resistance of the RF power generator into a plurality of impedances at a second node thereof. A match controller is coupled to the adjustable tuning elements of the RF tuning circuit, wherein the match controller controls and monitors positions of the adjustable tuning elements of the RF tuning circuit. A third communications interface is coupled to the match controller for receiving position information for and transmitting position information of the adjustable tuning elements of the RF tuning circuit. An RF impedance measurement module is coupled between the second node of the RF tuning circuit and the plasma processing chamber, and measuring RF voltage, RF current and frequency at the second node thereof, determines RF phase from the measured RF voltage and current, and calculates RF impedance at the second node from the measured RF voltage, RF current, RF phase and frequency. A fourth communications interface is coupled to the RF impedance measurement module for transmitting the measured RF voltage, RF current, RF phase, frequency and calculated impedance at the second node. A tool controller is adapted for controlling the RF power output of the RF power generator and instructing the match controller with processing recipe tuning element setting in generating the plasma. A fifth communications interface coupled to the tool controller. At least two of the first, second, third, fourth and fifth communications interfaces communicate with each other during operation of generating plasma in the plasma processing chamber.

Embodiments of the disclosure include a method for group processing of a plurality of semiconductor wafers with a plurality of plasma processing systems, by providing a master plasma processing system comprising a master radio frequency (RF) power generator, a master impedance matching unit having a first node coupled to the master RF power generator and a second node adapted for coupling to a master plasma processing chamber, the master impedance matching unit further comprises a master RF tuning circuit having adjustable tuning elements; and communications interfaces coupled to the master RF power generator and the master impedance matching unit. Further providing a plurality of slave plasma processing systems, each one of the plurality of slave plasma processing systems comprises a slave RF power generator, a slave impedance matching unit having a first node coupled to the slave RF power generator and a second node adapted for coupling to a slave plasma processing chamber, the slave impedance matching unit further comprises a slave RF tuning circuit having adjustable tuning elements and communications interfaces coupled to the slave RF power generator and the slave impedance matching unit. The method further provides for reading master power settings of the master RF power generator during a master plasma processing operation and communicating the master power settings to each of the slave RF power generators, wherein each of the slave RF power generators operate at the master power settings during slave plasma processing operations; and reading master position settings of the adjustable tuning elements of the master RF tuning circuit during the master plasma processing operation and communicating the master position settings to each of the slave impedance matching units, wherein each of the adjustable tuning elements of the slave impedance matching units operate at the same position settings of the adjustable tuning elements of the master RF tuning circuit during slave plasma processing operations. The method further provides recording the master power settings and the master position settings of the adjustable tuning elements before communicating them to the slave RF power generators and the slave impedance matching units.

BRIEF DESCRIPTION OF THE DRAWINGS

So that the manner in which the above recited features of the present disclosure can be better understood in detail, a more particular description of the disclosure, briefly summarized herein, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 6 illustrates a schematic block diagram of a match controller, according to specific example embodiments of this disclosure;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
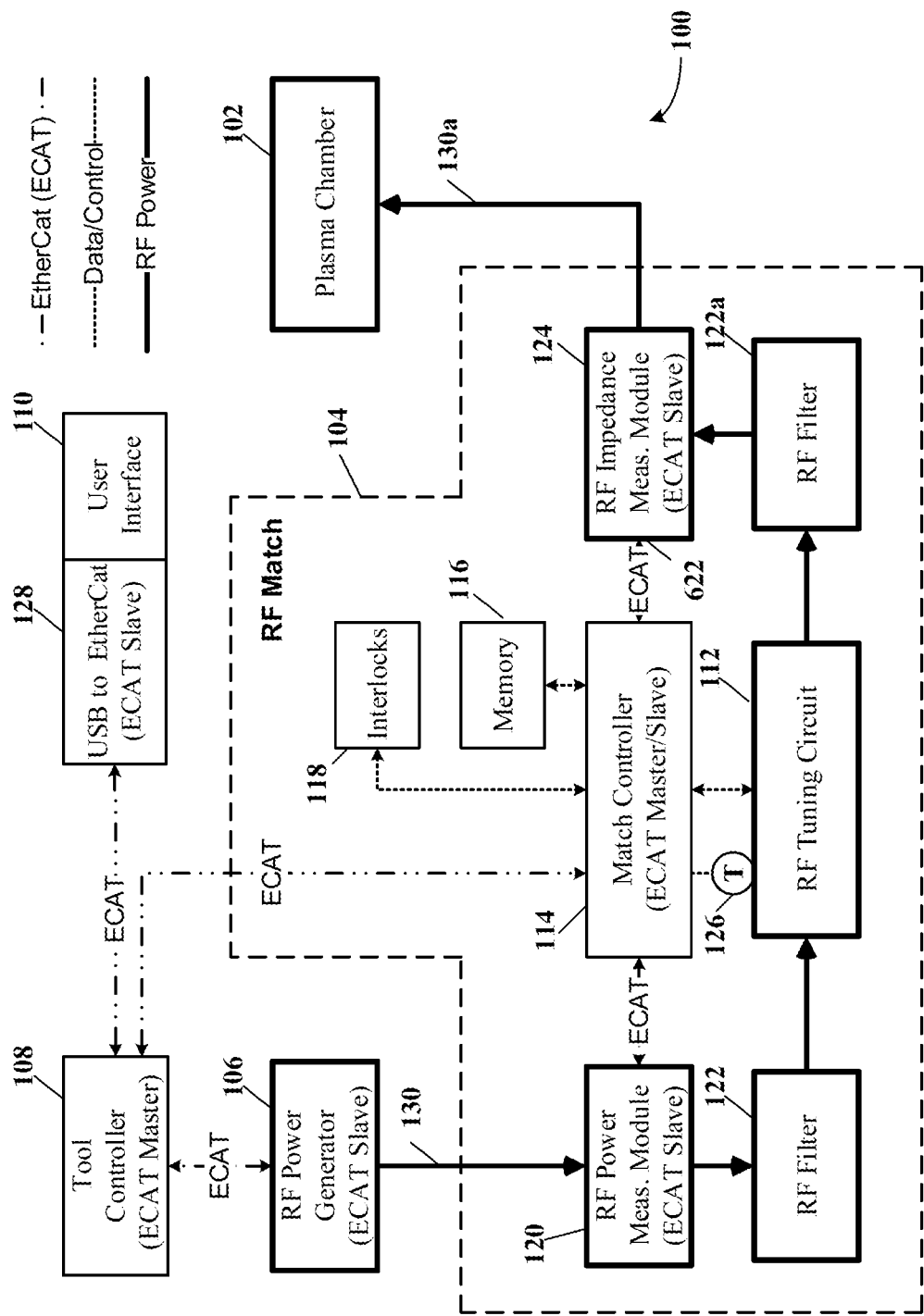
FIG. 1 illustrates a schematic block diagram of a semiconductor wafer plasma processing system having field replaceable sensor modules, according to specific example embodiments of this disclosure.

Embodiments of the present disclosure generally relate to apparatus and methods for rapid and inexpensive defect analysis, repair and replacement of equipment used in the manufacture of semiconductor devices. More specifically, embodiments provided herein generally include apparatus and methods for rapid and inexpensive repair and replacement of RF sensors necessary for the operation of radio frequency (RF) power generation and impedance matching equipment used for generating a plasma in a plasma chamber during semiconductor processing therein.

Embodiments of the present disclosure relate to input and output process sensors, e.g., RF voltage and current, frequency and RF power, that may be independent of an associated RF impedance matching unit in a plasma processing system and can be replaced upon failure or for periodic recalibration without disturbing or disassembling other parts of the plasma processing system. Sensors may be inside or outside the RF impedance matching unit structure and have RF power and communication (used for monitoring and control) connectors that are adapted for quick connection and disconnection, and may be interchangeable and reusable for design and operational extendibility, e.g., sensor modules may be swapped for periodic recalibration to ensure accuracy, resulting in reduced long-term operating and maintenance costs.

The process sensors may be configured into independent and autonomous module functions having application specific sensor interfaces, data processing, calculation and control. Independent module communications using high speed and secure communication protocols that provide for global communications between modules, tool controller and supervisory systems. Communications may be provided with industrial quality software protocols such as, for example but is not limited to, Ethernet for Control Automation Technology (EtherCaT) or (ECAT). EtherCat communications enables fast and easy module and system updating and maintenance in the field, and efficient testing and qualification during the process of manufacturing systems. Sensor and controller module testing, qualification and firmware/software updating may be done remotely using File over EtherCaT (FoE), which may reduce maintenance, calibration and logistics costs. Each EtherCat communications interface may have a unique address and be adapted to communicate sensor and control data to the other EtherCat communications interfaces, thereby making available all process information to all modules within a system.

RF Impedance and RF power sensor information from the independent RF impedance and power modules may be shared throughout the plasma processing system(s) for diagnostic purposes and algorithm pre-learning. Modules providing sensor information may be reusable for impedance matching unit design extendibility. Sensor modules may be adapted for use with other impedance matching units and/or operate at other RF frequencies and load impedances. Each sensor module may have a unique communications address and may be accessible with its data available to all other plasma processing system modules, controllers and process data logging in a manufacturing supervisory system.

In another embodiment of a plasma processing system comprising a plurality of plasma processing chambers, each chamber having a slave RF generator and slave impedance matching unit, one set of process sensor modules may be used to control operation of the slave RF generator and slave impedance matching units associated with the plurality of plasma processing chambers. Where the chambers and plasma processes are substantially the same, sensor information from only one process chamber may be needed and the other process chambers' associated slave RF generator and impedance match unit operations may be controlled by the lead or master process chamber/sensor module information (process data). This synchronization between multiple on-going plasma processes may be further shared for diagnostic purpose and algorithm pre-learning.

In some embodiments, sensor data of a plasma process may be used for learning purposes and recorded, then the sensors may be disconnected and the recorded learning process data used in place of the sensor data. The process control settings, e.g., impedance matching element setting positions and RF power process levels may be stored in a tool controller and subsequently used by the tool controller for a plurality of different process recipes. Thus, well established and consistent manufacturing processes may be performed without the necessity of sensor monitoring of the manufacturing processes. This is especially advantageous for a large number of chamber plasma processes occurring during a semiconductor device manufacturing day. The same process recipe need not be applied to all of the plasma processing systems at the same time. Different plasma processing recipes may be distributed among the manufacturing plasma chamber systems depending upon the manufacturing requirements for different semiconductor products.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic block diagram of a semiconductor wafer plasma processing system, according to specific example embodiments of this disclosure. The plasma processing system, generally represented by the numeral 100, may comprise a plasma chamber 102 for processing semiconductor wafers therein, an RF impedance matching unit 104, an RF power generator 106, a tool controller 108 and a user interface 110. The RF impedance matching unit 104, RF power generator 106, tool controller 108 and user interface 110 may communicate, control and monitor the delivery of RF power to the plasma chamber during processing using protocols such as, for example but is not limited to, Ethernet for Control Automation Technology (EtherCaT) or (ECAT), USB, serial RS-232, Ethernet, WiFi and Bluetooth. For purposes of discussion herein the primary means of communications, control and monitoring used will be EtherCat. EtherCaT or "ECAT" is a high-performance, low-cost, easy to use Industrial Ethernet technology with a flexible topology. More information on EtherCat may be found at the EtherCat Technology website https://www.ethercat.org, incorporated by reference herein for all purposes. EtherCat uses an Ethernet packet form of communications but is much faster and more robust than common Ethernet systems and other similar communication protocols. It is specifically applicable to industrial manufacturing processes requiring a high degree of security and reliability while maintaining high data and control throughput in real time.

Flexibility, interchangeability, reliability and rapid repair and replacement of defective modules are addressed in the embodiments disclosed herein. By making subsystems, e.g., equipment modules interchangeable in the field without requiring special installation and calibration procedures allows greater manufacturing up time and lower total system maintenance and manufacturing costs. Also, standardization and interoperability between subsystems reduces equipment costs and enhances ease in maintenance of equipment so designed and deployed.

The impedance matching unit 104 may comprise an RF tuning circuit 112, a match controller 114 for controlling the RF uniting circuit 112, a memory 116 coupled to the match controller 114, safety and operating interlocks 118, an RF power measurement module 120 having an input coupled to an output of the RF power generator 106, an RF filter 122 coupled between the RF power measurement module 120 and an input of the RF tuning circuit 112, another RF filter 122a coupled to the output of the RF tuning circuit 112, an RF impedance measurement module 124 and a temperature sensor 126. The match controller 114 may include a communications interface adapted for a communication protocol such, as for example but not limited to, EtherCat (ECAT) communications. The match controller 114 may be an ECAT master or slave, it is an ECAT slave for the external control loop, where the tool controller 108 is the ECAT master. On the other hand, it is an ECAT master for the internal control loop, where variable capacitors in the RF tuning circuit 112, RF sensor modules 120 and/or 124 may be an ECAT slaves. All of the aforementioned modules are accessible for monitoring and control through EtherCat (ECAT) communications.

A user interface 110, e.g., computer (laptop), may communicate with a tool controller 108 (EtherCat master) with a USB to EtherCat adapter 128 or may be coupled to the tool controller 108 using RS-232, WiFi or other standard communications protocols, not shown. This communications link may give the user interface 110 access to all sensor information and control of the plasma processing system 100 via, for example but not limited to, EtherCat communications coupled to each subsystem thereof. RF power from the RF power generator 106 may be coupled over a power delivery line 130, e.g., coaxial cable types LMR-600, TRU-500 and the like, to the RF power measurement module 120, and RF power from the impedance matching unit 104 may be coupled over the power delivery line 130a to the plasma chamber 102 RF coil(s) (not shown). It is contemplated and within the scope of this disclosure that the electrical conductor(s) used for delivery of RF power between modules and the plasma chamber 102 may include, but are not limited to: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical conductors/cable of (a)-(e).

Figure 2:
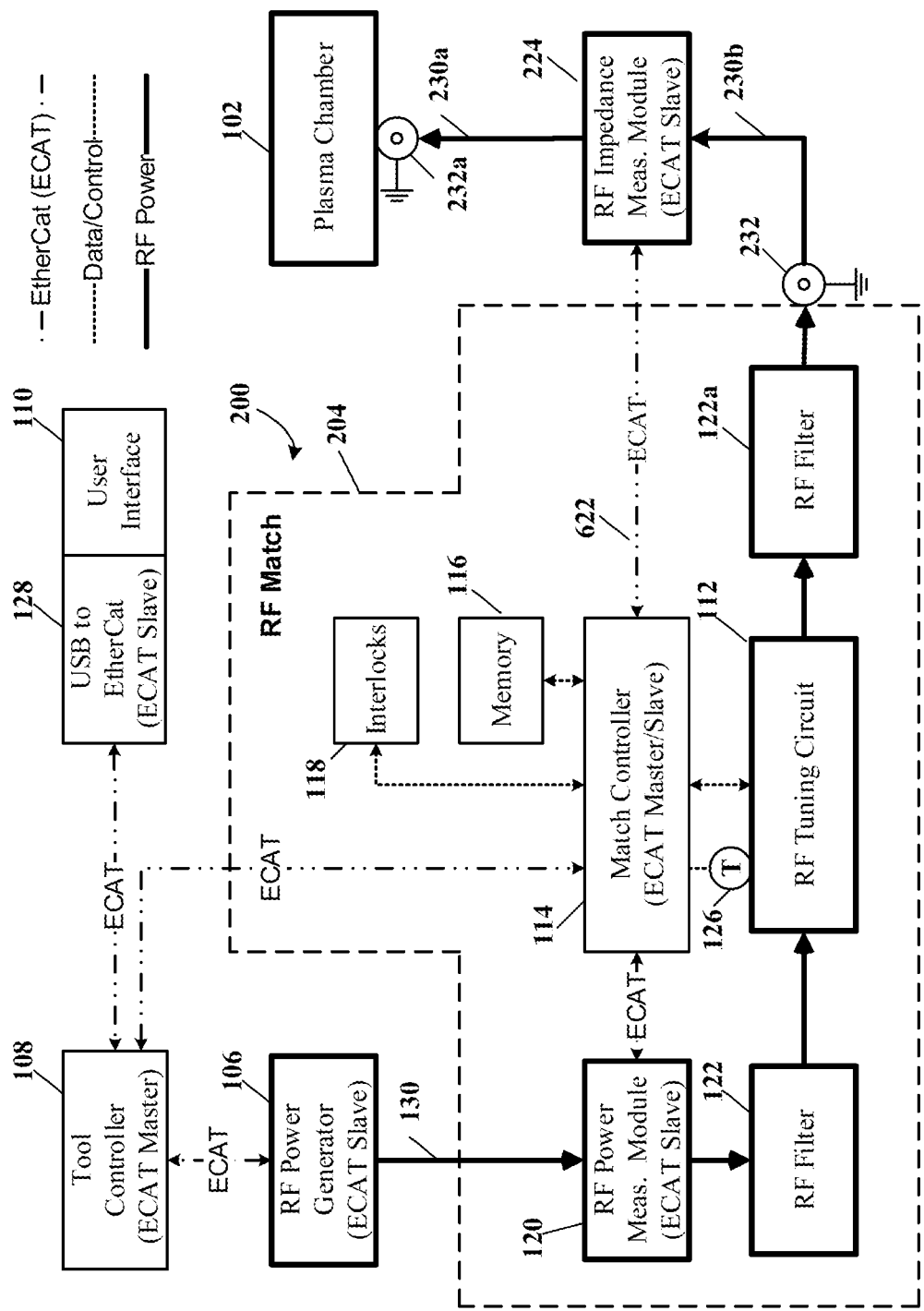
FIG. 2 illustrates a schematic block diagram of a semiconductor wafer plasma processing system having field replaceable external quick connect sensor modules, according to specific example embodiments of this disclosure.

Referring to FIG. 2, depicted is a schematic block diagram of a semiconductor wafer plasma processing system having field replaceable external quick connect sensor modules, according to specific example embodiments of this disclosure. The plasma processing system, generally represented by the numeral 200, may comprise a plasma chamber 102 for processing semiconductor wafers therein, an RF impedance matching unit 204, an RF power generator 106, a tool controller 108 and a user interface 110. The RF impedance matching unit 204, RF power generator 106, tool controller 108 and user interface 110 may communicate, control and monitor using protocols as described for the semiconductor wafer plasma processing system 100 described hereinabove.

The impedance matching unit 204 is substantially similar to the impedance matching unit 104 described hereinabove except that at least one RF measurement module, for example, RF impedance measurement module 224 is now external to the enclosure of the impedance matching unit 204, and is coupled to the RF filter 122a with a quick connect coaxial connector 232, for example but not limited to, an un-flanged coaxial connector manufactured by Myat, Inc., at www.myat.com. Functionally the plasma processing system 200 works the same as plasma processing system 100 shown in FIG. 1 but has an external RF measurement module, e.g., RF impedance measurement module 224, that may be easily removed and exchanged for a replacement module without disturbing any other components or having to disassemble the impedance matching unit 204 in the field. The only operation required for a field replacement of a defective RF impedance measurement module 224 would be disconnecting the coaxial cables 230a and 230b from coaxial connectors 232a and 232, respectively, and the EtherCat communications cable, then replacing the defective impedance measurement unit 204 with a working one, reconnecting the coaxial cables 230a and 230b back to coaxial connectors 232a and 232, and reconnecting the EtherCat communication/power cable (EtherCat-P). The impedance matching unit 204 may be so configured for any of the RF measurement modules and/or RF filters to be mounted externally for ease in field servicing and/or replacement. The RF impedance measurement module 224 may be a ECAT slave, communicating with the tool controller 108 or the match controller 114.

Radio Frequency Impedance and Power Determination

Radio frequency (RF) impedance is determined by the RF voltage V(t), RF current I(t), phase angle θ and frequency of an RF waveform. RF voltage and current sensors measure the RF voltage V(t) and RF current (I(t), and phase angle θ is determined therefrom. Frequency is measured with a frequency detector. Phase angle is the lead or lag times between the RF voltage V(t) and RF current I(t) waveforms and is expressed in degrees θ. RF power P(t) is the product of voltage and current, or P(t)=V(t)*I(t), while the respective RMS (root-mean-square) values after sensor detection are P=V*I*cos θ, where θ is the phase angle between the voltage and current waveforms. Using Ohm's Law Z(t)=V(t)/I(t) or Z may be expressed as Z=R+jX, where R=Z cos θ and jX=Z sin θ. jX=jωL−j/ωC, where ω=2πf, f is in frequency, C is in farads and L is in henrys. R is resistance in ohms and jX is reactance in ohms, where +jX is inductive reactance and −jX is capacitive reactance. Power is frequency independent and impedance is frequency dependent.

Figure 3:
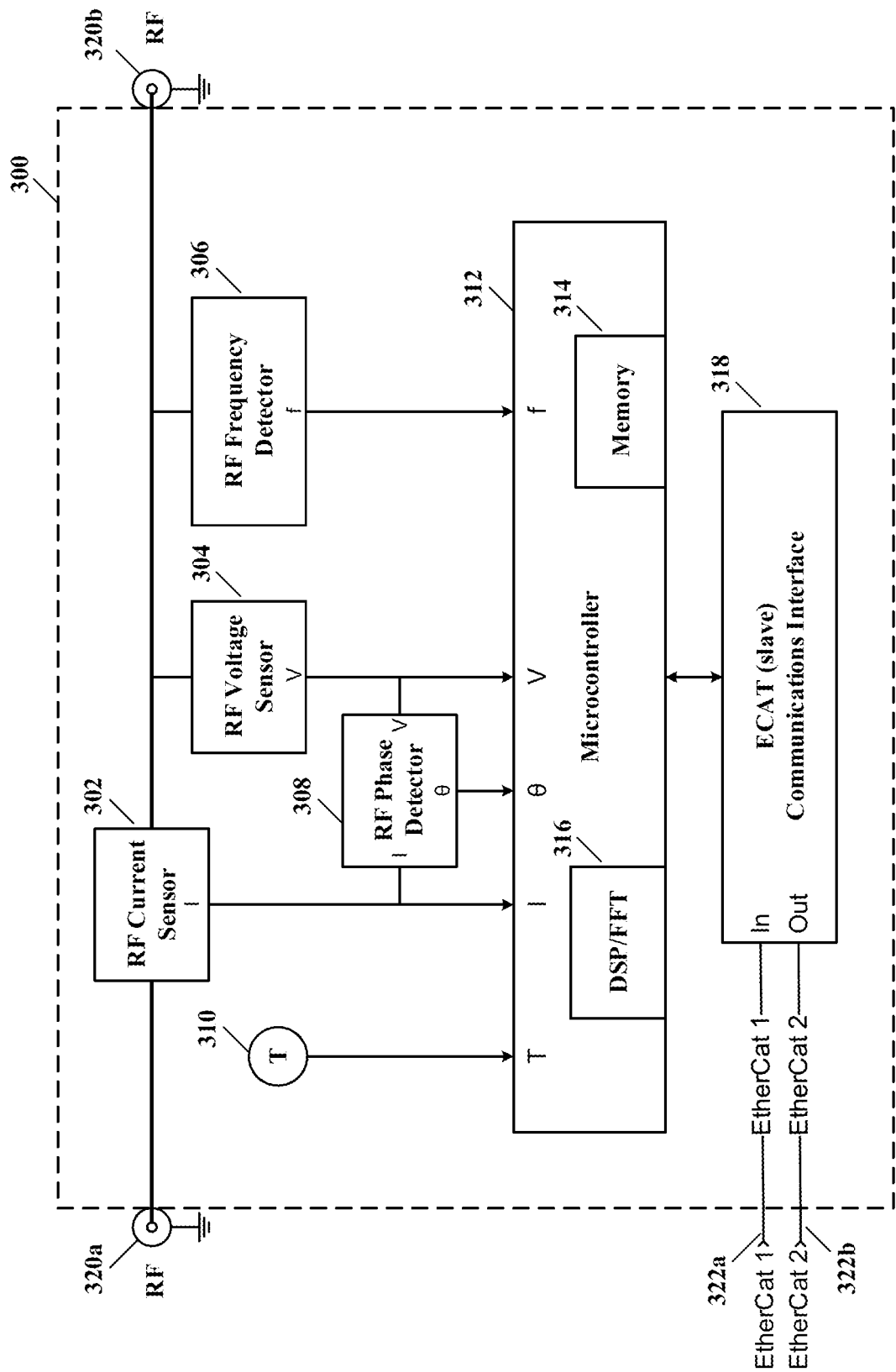
FIG. 3 illustrates a schematic block diagram of an RF impedance measurement module, according to specific example embodiments of this disclosure.

Referring to FIG. 3, depicted is a schematic block diagram of an RF impedance measurement module, according to specific example embodiments of this disclosure. The RF impedance measurement module 124 may comprise an RF current sensor 302, an RF voltage sensor 304, an RF frequency detector 306, an RF phase detector 308, a temperature sensor 310, a microcontroller 312 having a memory 314 and digital signal processing (DSP)/fast Fourier transform (FFT) 316 capabilities, and an EtherCat communications interface 318. The RF impedance measurement module 124 may further have coaxial connectors 320 that may be quick connect and flangeless for ease in remove and installation of the RF impedance measurement module 300, and EtherCat connectors 322a and 322b. The RF coaxial connectors 320a and 320b may be bidirectional so either one may be used as an RF input and the other as an RF output. The EtherCat communications interface 318 may be adapted for EtherCat-P which may provide DC power for the electronics of the RF impedance measurement module 124.

The RF current sensor 302 senses the RF current I(t) and the RF voltage sensor 304 senses the RF voltage V(t). The RF current I(t) and voltage V(t) are received by analog inputs of the microcontroller 312 and may then be converted into digital representations thereof. The phase angle θ (time difference between I(t) and V(t)) may be determined with the phase detector 308 or may be determined after I(t) and V(t) have been converted into digital representations. Either way the phase angle θ can be converted into a digital format by the microcontroller 312. The RF frequency detector 306 provides frequency information to the microcontroller 312 in a digital format, e.g., from a time-based digital counter. Once RF current, voltage, phase and frequency are known the impedance at the RF coaxial connectors 320 may be calculated as well as the RF power going into the load (plasma processing chamber), as described hereinabove, with the DSP/FFT 316 function of the microcontroller 312. The memory 314 may be adapted to store the real time impedances and power calculated and may also be used to store calibration coefficients for the RF current and voltage sensors, and the frequency and phase detectors. Also, sensor, detector, impedance and power information may be presented in digital format from the microcontroller 312 to the EtherCat communications interface 318 for use (information and control) by the plasma processing system 100 and other subsystems thereof.

Radio Frequency Forward and Reverse Power and Voltage Standing Wave Ratio

Measurement of forward and reverse RF power is useful in maximizing the most efficient power transfer from an RF generator by adjusting an impedance matching network to match the output impedance of the RF generator, generally 50-ohms, to a complex load impedance of a plasma process chamber. Forward and reverse RF power sensors (detectors) are useful in obtaining the information to adjust the impedance matching network for maximum forward RF power acceptance from and to minimum reverse RF power returning back to the RF generator. The forward and reverse power sensors may also be used to determine standing wave ratio (SWR) along a transmission line from the output of the RF generator to the input of the matching network. Since the transmission line (e.g., coaxial cable) length between the RF generator and impedance matching network is very short in relation to the wavelength of the RF signal from the RF generator, the length of the transmission line can be ignored, and SWR is then used as a measure of the match quality of the impedance matching network to the RF generator. Since the output of the RF generator is at a fixed impedance (e.g., 50-ohms), the SWR is usually thought of in terms of the maximum and minimum RF voltages along the transmission line (in this case at the output of the RF generator), and is called the voltage standing wave ratio or VSWR.

SWR may be determined from the effective forward and reflected voltages at the output of the RF generator for the characteristic impedance for which the SWR detector has been designed. Since the power of the forward and reflected RF waves are proportional to the square of the voltage components due to each forward and reflected RF wave, SWR can be expressed in terms of forward and reflected power, where Pf is forward power and Pr is reflected power:

$$SWR = \frac{1+\sqrt{\frac{Pr}{Pf}}}{1-\sqrt{\frac{Pr}{Pf}}}$$

As mentioned above, measurement of forward and reflected RF power is not frequency dependent like measurement of RF impedance, and is based upon a fixed known resistance, e.g., 50-ohms, thus SWR measurement is likewise not frequency dependent. However, to be accurate it must be measured at a known fixed resistance which is why power and SWR measurements are done at the known fixed resistance output of the RF generator, and not used at the complex impedance load side of the impedance matching network where RF voltage, current and frequency sensors have to be relied upon in determining plasma process impedances.

Figure 4:
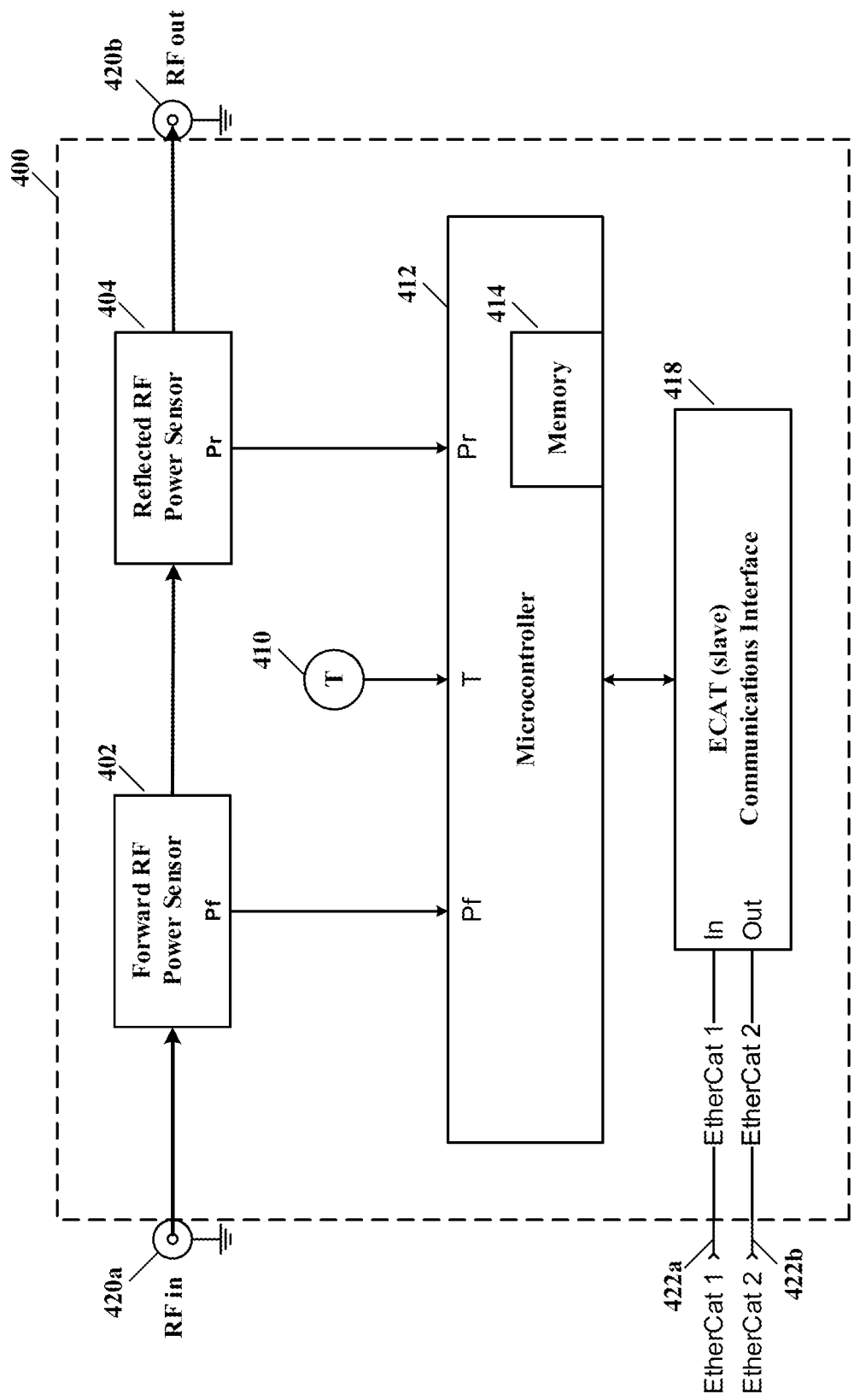
FIG. 4 illustrates a schematic block diagram of an RFan RF power measurement module, according to specific example embodiments of this disclosure.

Referring to FIG. 4, depicted is a schematic block diagram of an RF power measurement module, according to specific example embodiments of this disclosure. The RF power measurement module 120 may comprise a forward RF power sensor 402, a reflected RF power sensor 404, a temperature sensor 410, a microcontroller 412 having a memory 414, and an EtherCat communications interface 418. The RF power measurement module 120 may further have coaxial connectors 420 that may be quick connect and flangeless for ease in remove and installation of the RF power measurement module 120, and EtherCat connectors 422a and 422b. The EtherCat communications interface 418 may be adapted for EtherCat-P which may provide DC power for the electronics of the RF power measurement module 120.

The forward RF power sensor 402 senses the RF power going to the input of the RF tuning unit 112 and the reflected RF power sensor 404 senses the RF power reflected back from the RF tuning unit 112. The SWR and reflected RF power may be used to verify proper operation of the RF tuning unit 112 and/or assist the matching operation thereof (e.g., adjust RF tuning unit 112 for minimum SWR and/or reflected RF power). The forward and reflected RF power values from the forward and reflected RF power sensors 402 and 404, respectively, are received by analog inputs of the microcontroller 412 and may then be converted into digital representations thereof. SWR at the RF out coaxial connector 420b may be calculated from the forward and reflected RF power values, as described hereinabove. The forward and reflected power, and SWR information may be presented in digital format from the microcontroller 412 to the EtherCat communications interface 418 for use (information and control) by the plasma processing system 100 and other subsystems thereof, e.g., match controller 114.

Impedance Matching Unit Control and Tuning

Figure 5A:
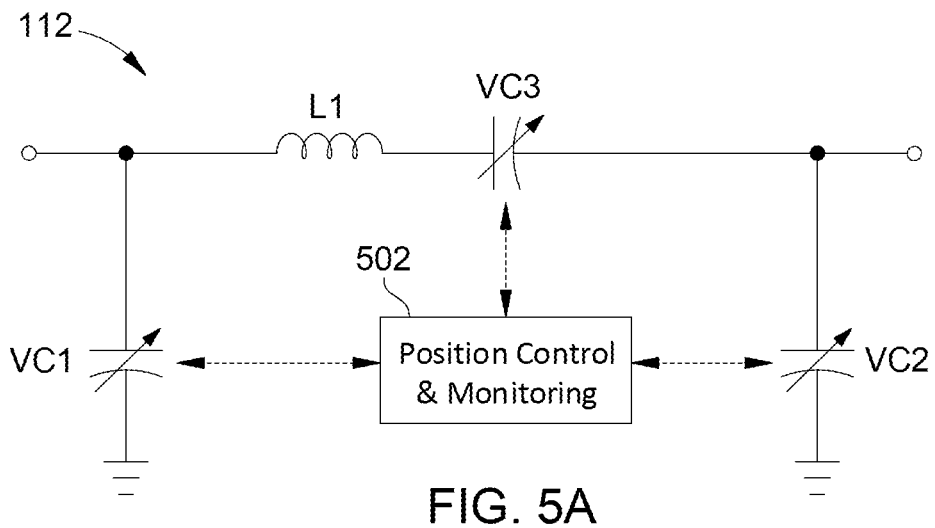
FIGS. 5A, 5B and 5C illustrate schematic diagrams of RF tuning circuits, according to specific example embodiments of this disclosure.
Figure 5B:
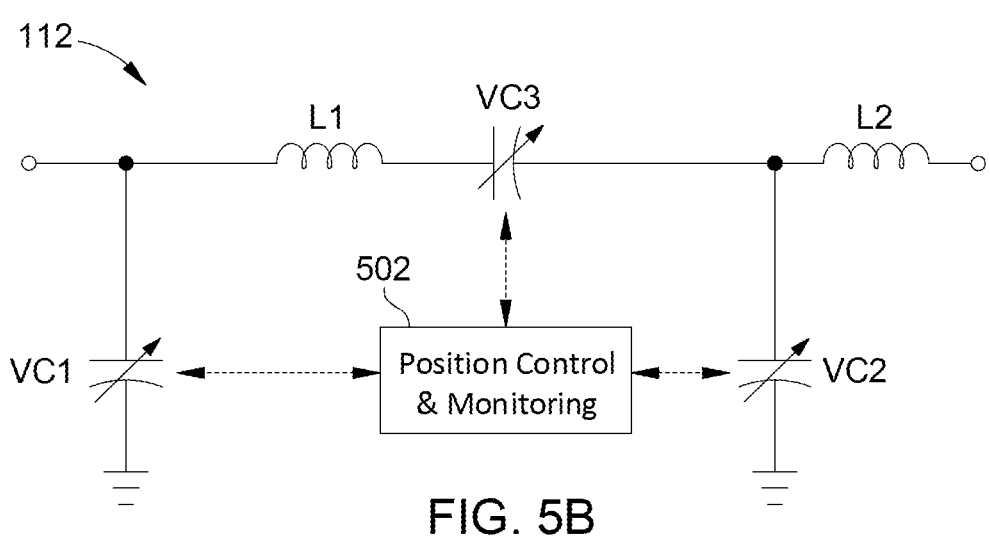
Figure 5C:
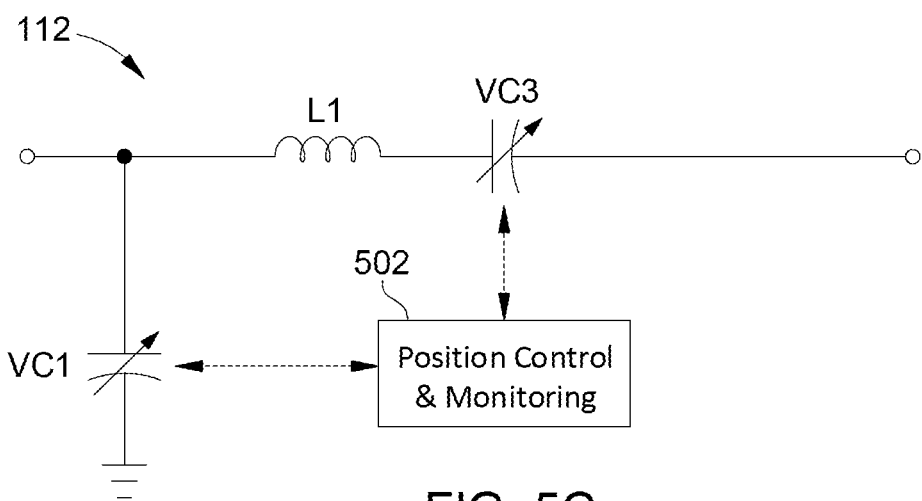

Referring to FIGS. 5A, 5B and 5C, depicted are schematic diagrams of RF tuning circuits, according to specific example embodiments of this disclosure. FIGS. 5A and 5B show three variable capacitors VC1, VC2 and VC3, and FIG. 5C shows two variable capacitors VC1 and VC3, e.g., motorized vacuum variable capacitors, and are example representations in combination with inductor L1 (and L2) for the RF tuning circuit 112. The variable capacitors VC1, VC2 and VC3 may have a capacitive range, but are not limited to, from about 3 pF to about 5000 pF. L1 is an inductor and may have an inductive range of, but is not limited to, about 0.01 pH to about 1000 pH. VC3 may be used to adjust a target frequency from about 100 kHz to about 250 MHz, and VC1 and VC2 may be used to tune to a target impedance. In some embodiments, especially complex loads for lower frequencies, the RF circuit schematic configuration shown in FIG. 5B may be implemented. An additional inductor L2 may be added for adjusting the RF tuning circuit 112 to a desired value. Inductor L2 may be in a range of, but is not limited to, about 0.01 pH to about 1000 pH. A low pass Pi matching circuit is shown in FIGS. 5A and 5B. In some embodiments, the RF tuning circuit 112 may be an L type circuit as shown in FIG. 5C, using only two motorized vacuum variable capacitors, e.g., VC1 and VC3. The capacitance and/or inductance values of the variable elements, e.g., VC1, VC2, VC3; may be controlled and monitored by a position control and monitoring circuit 502 for each variable element (one shown). Additional capacitors and/or inductors may also be switched into the matching circuit as required (not shown). A motor position actuator of the position control and monitoring circuit 502 may also include a position sensor that indicates the mechanical position of the adjustable element, e.g., amount of shaft rotation of the variable vacuum capacitor or a synchronized stepper motor position count after minimum and maximum rotation positions have been determined (detection of maximum and minimum clockwise and counter-clockwise shaft rotations). Position values may be correlated in a capacitance (or inductance)—position value table so that capacitance and/or inductance values may be monitored and set to a desired position based upon a required capacitance/inductance value. Tuning element position values may be used for monitoring and presetting tuning element positions according to the teachings of this disclosure.

Referring to FIG. 6, depicted is a schematic block diagram of a match controller, according to specific example embodiments of this disclosure. The match controller 114 may monitor and control the variable elements (e.g., variable capacitors VC1, VC2 and VC3) of the RF tuning circuit 112. The match controller 114 may comprise a microcontroller 612, a memory (volatile and/or non-volatile) 614, stepper motor drivers and position sensors 502 (FIG. 5), and an EtherCat communications interface 618. Via EtherCat communications, the microcontroller 612 may receive plasma chamber impedance information from an associated RF impedance measurement module 124 or 224 and/or the RF power measurement module 120. Then from this impedance information control the positions of the variable elements (e.g., variable capacitors VC1, VC2 and VC3) of the RF tuning circuit 112 to complete an impedance match between the RF power generator 106 and plasma chamber 102.

When in a slave mode (FIGS. 9 and 10), the microcontroller 612 may receive positions for the variable elements (e.g., variable capacitors VC1, VC2 and VC3), via EtherCat communications, based upon a substantially identical RF tuning circuit 112 of another plasma processing system 100 acting as a process master. This enables batch processing of the same semiconductor wafer work pieces using a plurality of substantially similar plasma processing systems slaved to a master plasma processing system (FIG. 10). Alternatively, in high production and well-known plasma processes the microcontroller 612 may receive positions for the variable elements (e.g., variable capacitors VC1, VC2 and VC3), via EtherCat communications, based upon a prerecorded process recipe. The process recipe containing the positions of the variable elements may be stored in the memory 614 to reduce EtherCat communications and microprocessor operational times. This allows the process to use the process data stored in the memory 614 which has the stored positions over the process time, for an autonomous plasma process requiring no external inputs.

Figure 7:
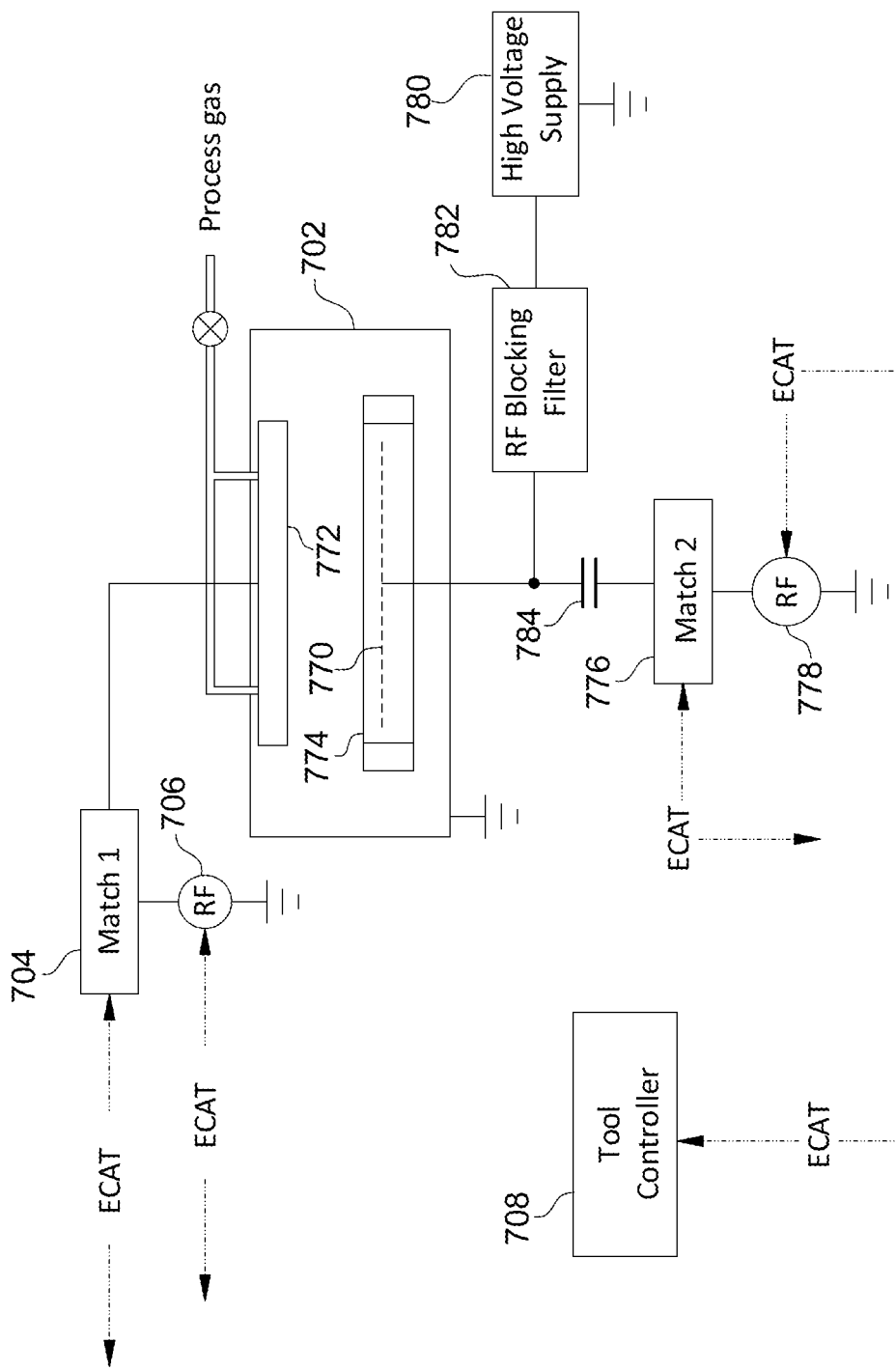
FIG. 7 is a schematic view of a plasma processing chamber having two impedance matching units, according to specific example embodiments of this disclosure.

Referring to FIG. 7, depicted is a schematic block diagram of a plasma processing chamber having two impedance matching units, according to specific example embodiments of this disclosure. A plasma processing chamber 702 includes an RF electrode 772 and a work piece pedestal 774. The RF electrode 772 is coupled to a first impedance matching unit 704 which receive RF power from an RF power generator 706. In one example, the RF electrode 772 could be a showerhead that is used to form a capacitively coupled plasma in the plasma processing chamber 702, or even a multi-turn coil that is used to form an inductively coupled plasma in the plasma processing chamber 702. A second impedance matching unit 776 is coupled between the work piece pedestal 774 and an RF power generator 778. DC blocking capacitor 784 blocks high voltage DC from the high voltage supply 780 and may also function as a high pass filter.

Optionally, an RF impedance measurement module like sensor module 224 (FIG. 2), may be at the output of match 776 and/or between the pedestal 774 and the second impedance match 776. It is contemplated and within the scope of this disclosure that one or more sensor modules may be shared among the two impedance matching units 704 and 776. Sensor modules may be used for only learning purpose and then be removed. Sensors modules may be adapted to form virtual match groups, for example, data measured at the output of the impedance matching unit 776 may be used to control the impedance matching unit 704. Sensor modules may also be added to other places, e.g., roof, liner, baffle (not shown), and may provide measurement values that may be used to adjust any tuning element capacitors.

The electrical characteristics of a plasma formed by use of the first impedance matching unit 704, RF power generator 706, second impedance matching unit 776 and RF power generator 778 may be monitored by use of a sensor module 224 coupled a node positioned between the embedded electrode 770 and the second impedance match 776 or the first impedance match 704 and the RF electrode 772. The information from and control of these items may be processed in a tool controller 708 which communicates to each over individual EtherCat communications lines. The impedance matching units 704 and 776 may be controlled by the tool controller 708 through communications over the EtherCat communications lines. What sensor information is used to control what matching unit(s) is just a function of how the process is programmed since all monitoring and control is available for all process system elements, e.g., sensors, match unit element tuning, RF power output.

Figure 8:
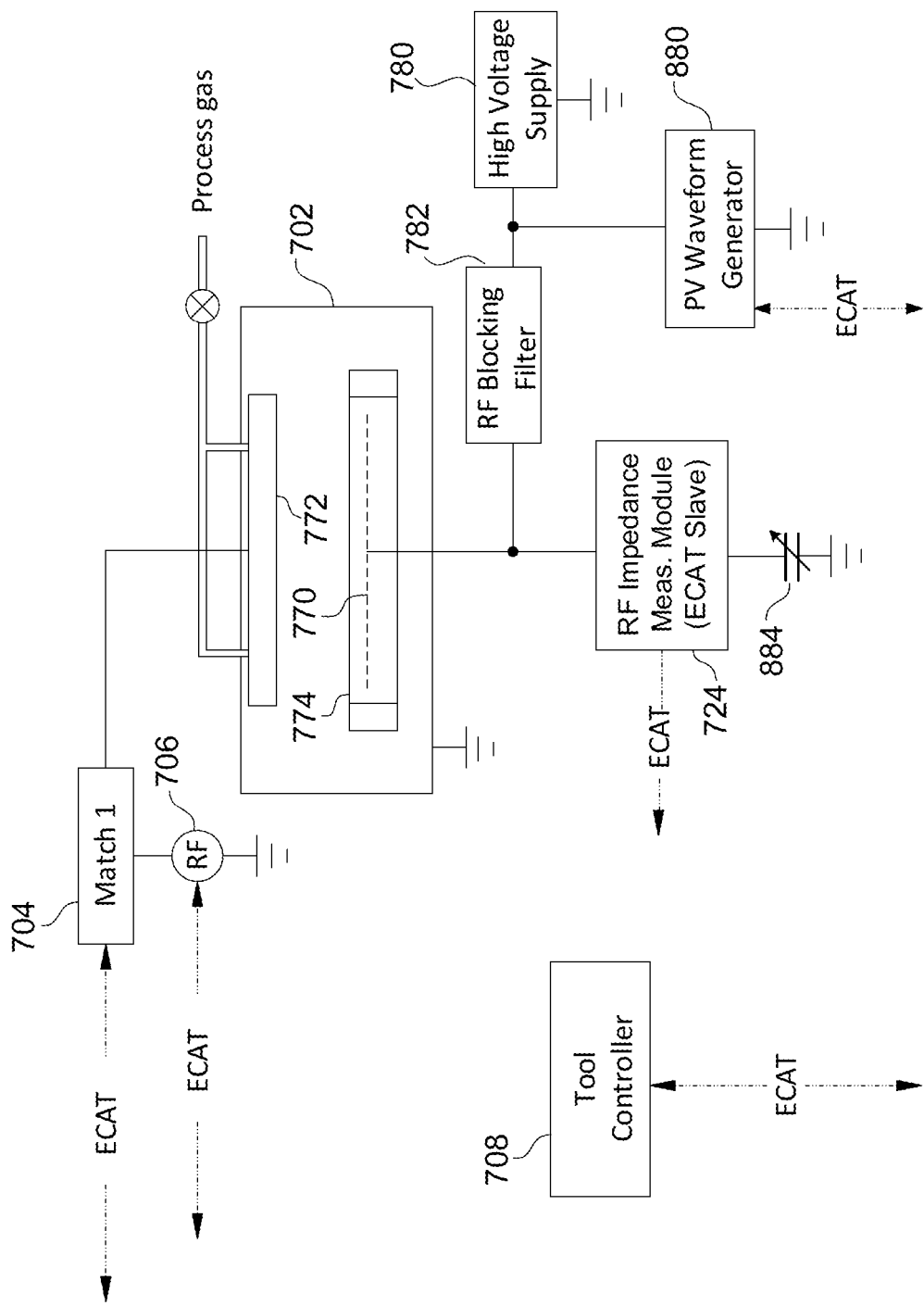
FIG. 8 is a schematic view of a plasma processing chamber having one impedance matching unit controlled by a remote sensor, according to specific example embodiments of this disclosure.

Referring to FIG. 8, depicted is a schematic block diagram of a plasma processing chamber having one impedance matching unit controlled by a remote sensor, according to specific example embodiments of this disclosure. The plasma processing chamber system shown in FIG. 8 is similar to the one shown in FIG. 7, except the second impedance matching unit 776 and RF power generator 778 have been removed, and a PV waveform generator 880 has been added. A PV waveform generator 880 may be substituted in place of the RF bias generator 778 illustrated in FIG. 7. The high voltage supply 780 and the PV waveform generator 880 may be DC coupled through the RF blocking filter 782 to the sensor 724 that is coupled to a transmission line connected to the embedded electrode 770. The output of the first impedance matching unit 704 and RF power generator 706, and/or PV waveform generator 880, can be controlled by use of signals provide from the sensors 724 and the tool controller 708. The information from and control of these items may be processed in a tool controller 708 which communicates to each over individual EtherCat communications lines.

Capacitor 884 blocks high voltage DC from the high voltage supply 780 coupling to ground but allows an RF return path for the sensors 724. The Capacitor 884 may also function as a high pass filter and/or RF return tuning. In some embodiments, the first impedance matching unit 706 and RF generator 704 may be coupled to the embedded electrode 770 and the sensors 724 may be coupled to the RF electrode 772. The capacitor 884 may alternately be located between the RF blocking filter 782 and the sensors 724, instead of between the sensors 724 and ground.

It is contemplated and within the scope of this disclosure that the RF sensing and tuning elements associated with an RF matching unit are not required to be within the same enclosure, and devices on the ECAT network may be adapted to form virtual RF measurement groups. Typically, the RF voltage and current sensors may be at the input and output of an impedance matching unit, or only at the input (no output sensor). According to the teachings of this disclosure, sensors may be located outside the impedance matching unit enclosure and form a virtual group with any impedance matching units on the plasma processing equipment through a tool controller. The input and output RF sensors do not have to be physically within the impedance matching unit enclosure. For example, RF input sensors can be close to the RF generator 778 and 708, and output RF sensors can be close to the RF electrode 772 and/or a work piece pedestal 774. The tool controller 708 may collect RF sensor data and tune the tuning elements in the same network. A match controller 114 is optional. In some embodiments, the tool controller 108 can directly communicating with all sensors, tuning elements, and RF generators. And in some other embodiments, the tool controller 108 can communicating with shared sensors 224, RF generators and match controllers, and the match controllers may communicate with local tuning elements, and local sensor modules 120 and/or 124. This is very easy to do since all are accessible to each other via the EtherCat communications.

Figure 9:
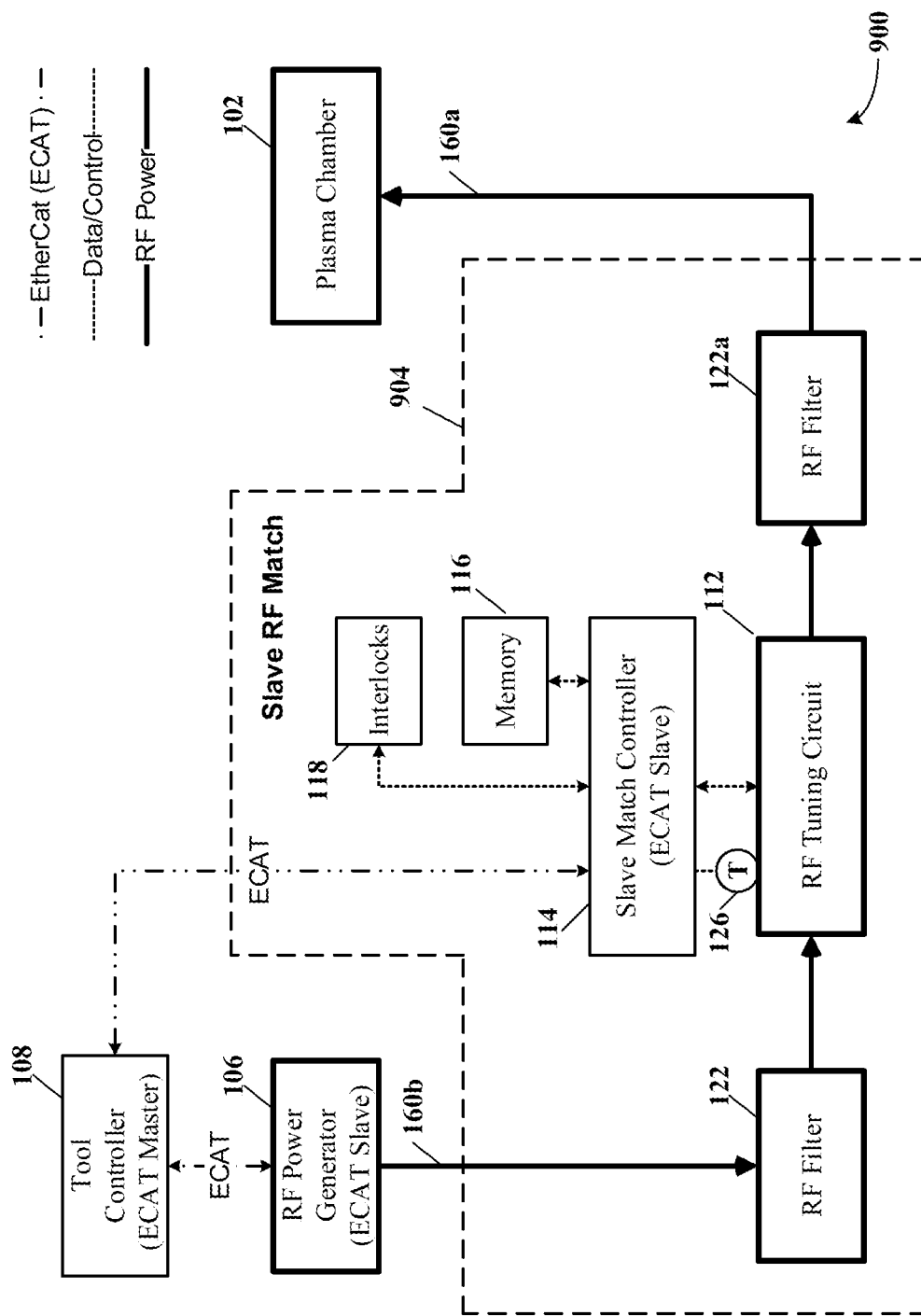
FIG. 9 illustrates a schematic block diagram of a slave semiconductor wafer plasma processing system, according to specific example embodiments of this disclosure.
Figure 10:
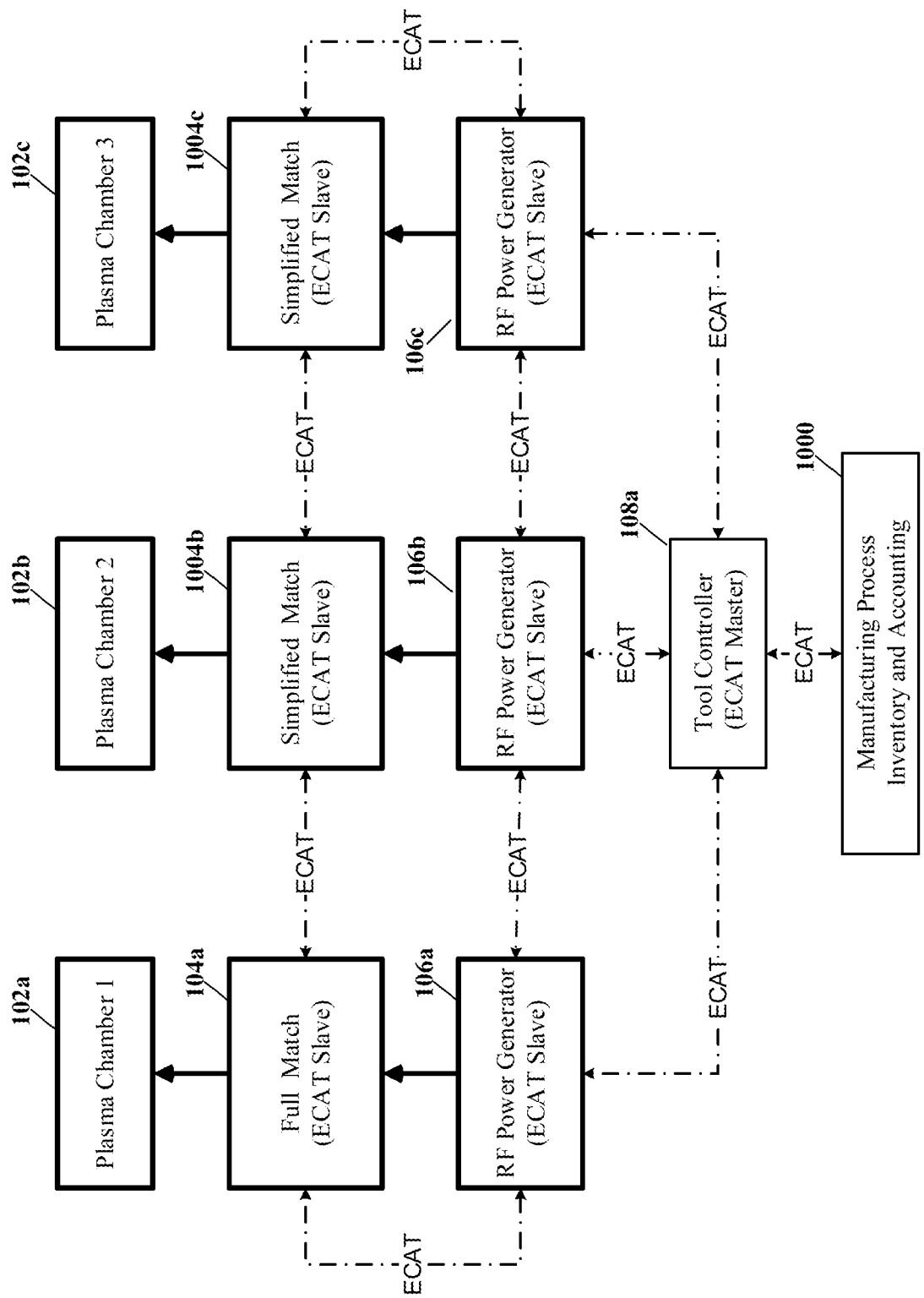
FIG. 10 illustrates a schematic block diagram of a multiple semiconductor wafer plasma processing system having one master plasma processing subsystem and a plurality of slave plasma processing subsystems, according to specific example embodiments of this disclosure.

Referring to FIG. 9, depicted is a slave semiconductor wafer plasma processing system, according to specific example embodiments of this disclosure. The slave plasma processing system, generally represented by the numeral 900, may comprise a plasma chamber 102 for processing semiconductor wafers therein, an RF impedance matching unit 904, an RF power generator 106, and a tool controller 108. The impedance matching unit 904 is substantially similar to the impedance matching units 104 and 204 described hereinabove except that there are no local sensors present. Rather all operational controls of the RF tuning unit 112 and RF power generator are derived from a remote-control source. The tool controller 108, optionally, may be eliminated and a remote master tool controller 108 is used such as the one in the plasma processing systems 100 and 200 described hereinabove. In some embodiments, the remote master tool controller 108 may directly control RF tuning unit 112, and the match controller 114 may not be required.

If the slave plasma processing system 900 is substantially similar physically (hardware) to a master plasma processing system 100 or 200 and the same process recipe is being used, then the positions for the variable elements (e.g., variable capacitors VC1, VC2 and VC3), may be sent via EtherCat communications directly to the slave match controller 114 for directly setting the tuning element positions of the RF tuning circuit 112 (replication of master RF tuning circuit element positions). In some embodiment, local sensor modules 120 and/or 124 may be optionally positioned between the RF power generator 106 and the RF filter module 122. Having all modules accessible to read status and for control thereof provides for application flexibility.

Referring to FIG. 10, depicted is a schematic block diagram of a multiple wafer plasma processing system having one master plasma processing subsystem and a plurality of slave plasma processing subsystems, according to specific example embodiments of this disclosure. This multi-chamber plasma processing system is an expansion of the slave processing system shown in FIG. 9 and described hereinabove. For batch processing of the same semiconductor wafer using substantially the same plasma processing hardware, e.g., plasma chamber 102, impedance matching unit 104 and RF power generator 106, the same RF power and tuning element settings may be used for each plasma processing subsystem. This implementation is cost effective for batch processing of a plurality of semiconductor wafers.

The master plasma processing subsystem may comprise modules 102*a*, 104*a* and 106*a* that have an RF current sensor 302, an RF voltage sensor 304, an RF phase detector 308, a frequency detector 306, a forward RF power sensor 402 and a reflected RF power sensor 404, and operate substantially the same as the plasma processing systems 100 and 200. The other slave plasma processing subsystems will just mimic (replicate) the RF power and tuning element settings of the master plasma processing subsystem. Optionally all of the plasma processing subsystems may be slave systems and a prerecorded process recipe may control the RF power generators 106 and tuning element settings of the impedance matching units 1004. Different prerecorded process recipes may also be used with respective plasma chambers for batch processing of different semiconductor wafer products. The aforementioned process options are easily implemented using the communications interconnectivity of EtherCat, The present disclosure has been described in terms of one or more embodiments, and it should be appreciated that many equivalents, alternatives, variations, and modifications, aside from those expressly stated, are possible and within the scope of the disclosure.

What is claimed is:

1. A radio frequency (RF) impedance matching unit adapted for coupling between an RF power generator and a plasma processing chamber, comprising:
    an RF tuning circuit having a first node adapted for coupling to an RF power generator, a second node adapted for coupling to a plasma processing chamber, and adjustable tuning elements for transforming an output resistance of the RF power generator into a plurality of impedances at the second node;
    a match controller coupled to the adjustable tuning elements of the RF tuning circuit, wherein the match controller controls and monitors positions of the adjustable tuning elements of the RF tuning circuit;
    a first communications interface coupled to the match controller for receiving position information for and transmitting position information of the adjustable tuning elements of the RF tuning circuit; and
    an RF impedance measurement module coupled between the second node of the RF tuning circuit and the plasma processing chamber, the RF impedance measurement module comprising:
        a frequency detector having an input coupled to the second node;
        an RF phase detector;
        a microcontroller having inputs that are configured to receive signal information from outputs of the frequency detector and the RF phase detector; and
        a second communications interface coupled to the microcontroller and adapted for communicating measured frequency and RF phase.

2. The RF impedance matching unit of claim 1, wherein the RF impedance measurement module comprises:
    a sensor assembly that comprises:
        an RF current sensor coupled between the second node and the plasma processing chamber;
        an RF voltage sensor having an input coupled to the second node;
        the frequency detector; and
        the RF phase detector coupled to outputs of the RF voltage and current sensors;
    the microcontroller having additional inputs that are configured to receive additional signal information from the outputs of the RF current sensor and the RF voltage sensor; and
    the second communications interface adapted for communicating measured RF voltage and RF current.

3. The RF impedance matching unit of claim 2, wherein the microcontroller calculates RF impedance from the measured RF voltage, RF current, frequency, and RF phase, wherein the calculated RF impedance is available for communications by the second communications interface.

4. The RF impedance matching unit of claim 1, wherein the RF impedance measurement module is integral with the RF impedance matching unit.

5. The RF impedance matching unit of claim 1, wherein the RF impedance measurement module is separate from the RF impedance matching unit, and adapted for coupling between the RF impedance matching unit and the plasma processing chamber with quick connect coaxial RF connectors.

6. The RF impedance matching unit of claim 1, further comprising an RF power measurement module coupled between the RF power generator and the first node of the RF tuning circuit.

7. The RF impedance matching unit of claim 6, wherein the RF power measurement module comprises:
    a forward RF power sensor;
    a reflected RF power sensor;
    an additional microcontroller having inputs coupled to outputs of the forward and reflected RF power sensors, and that calculates standing wave ratio (SWR) from measured forward and reflected RF power; and
    a third communications interface coupled to the additional microcontroller and adapted for communicating the measured forward and reflected RF power and calculated SWR.

8. The RF impedance matching unit of claim 7, wherein the first, second, third and fourth communications interfaces are adapted for communicating with an Ethernet for Control Automation Technology (EtherCaT) communications protocol.

9. The RF impedance matching unit of claim 6, wherein the RF power measurement module is integral with the RF impedance matching unit.

10. The RF impedance matching unit of claim 6, wherein the RF power measurement module is separate from the RF impedance matching unit, and adapted for coupling between the RF power generator and the RF impedance matching unit with quick connect coaxial RF connectors.

11. The RF impedance matching unit of claim 1, wherein the match controller comprises:
an additional microcontroller in communications with the first communications interface and having:
inputs and outputs for monitoring positions of and controlling the adjustable elements of the variable impedance network, and
a memory that includes information relating to a plurality of settings of one or more of the adjustable tuning elements stored therein,
wherein the plurality of settings of one or more of the adjustable tuning elements are configured to be used to match a selected one of the plurality of impedances at the second node to the RF power generator output resistance.

12. A system for controlling and monitoring a radio frequency (RF) power generator and impedance matching unit adapted for generating a plasma in a plasma processing chamber, comprising:
an RF power generator having an RF power output and coupled to a first communications interface for monitoring and control thereof;
an RF power measurement module coupled to the output of the RF power generator, and measuring forward and reflected RF power at the output thereof, and calculating standing wave ratio (SWR) from the measured forward and reflected RF power;
a second communications interface coupled to the RF power measurement module for transmitting the measured forward and reflected RF power and calculated SWR;
an RF tuning circuit having a first node coupled to the RF power measurement module, and adjustable tuning elements for transforming an output resistance of the RF power generator into a plurality of impedances at a second node thereof;
a match controller coupled to the adjustable tuning elements of the RF tuning circuit, wherein the match controller controls and monitors positions of the adjustable tuning elements of the RF tuning circuit;
a third communications interface coupled to the match controller for receiving position information for and transmitting position information of the adjustable tuning elements of the RF tuning circuit;
an RF impedance measurement module coupled between the second node of RF tuning circuit and the plasma processing chamber, and measuring RF voltage, RF current and frequency at the second node thereof, determining RF phase from the measured RF voltage and RF current, and calculating RF impedance at the second node from the measured RF voltage, RF current, RF phase and frequency; and
a fourth communications interface coupled to the RF impedance measurement module for transmitting the measured RF voltage, RF current, RF phase, frequency and calculated impedance at the second node;
a tool controller adapted for controlling the RF power output of the RF power generator in generating the plasma;
a fifth communications interface coupled to the tool controller;
wherein at least two of the first, second, third, fourth and fifth communications interfaces communicate with each other during an operation of generating the plasma in the plasma processing chamber.

13. The system of claim 12, further comprising one or more slave RF power generators and one or more slave impedance matching units, each having communications interface, and adapted for generating plasmas in one or more additional plasma processing chambers, wherein a set of process sensor modules controls operation of the one or more slave RF power generators and the one or more slave impedance matching units associated with the one or more additional plasma processing chambers.

14. The system of claim 13, wherein the tool controller is in communications with
the first, second, third and fourth communications interfaces associated with the RF power generator, RF power measurement module, match controller, and RF impedance measurement module, respectively; and
the communications interfaces associated with the one or more slave RF power generators and the one or more slave impedance matching units;
wherein the tool controller receives operational configurations of the RF power generator and the impedance matching unit through the respective communications interfaces thereof, and transmits these operational configurations to the one or more slave RF power generators and the one or more slave impedance matching units through the respective communications interfaces thereof.

15. The system of claim 13, wherein a tool controller has a communications interface and is in communications with
the first, second, third and fourth communications interfaces associated with the RF power generator, RF power measurement module, match controller, and RF impedance measurement module, respectively; and
the communications interfaces associated with the one or more slave RF power generators and the one or more slave impedance matching units;
wherein the tool controller receives operational configurations during a semiconductor wafer manufacturing process of the RF power generator and the impedance matching unit through the respective communications interfaces thereof, and transmits the received operational configurations to the one or more slave RF power generators and the one or more slave impedance matching units through the respective communications interfaces thereof.

16. The system of claim 12, wherein the RF impedance measurement module and RF tuning circuit are adapted for RF coupling and communicating therebetween, and in different enclosures independent of each other.

17. The system of claim 12, wherein the tool controller replaces operation of the match controller, no longer required, and directly communicates with the RF power generator, the RF power measurement module, the RF tuning circuits, and the RF impedance measurement module.

18. The system of claim 12, wherein:
the RF power measurement module and the second communications interface are enclosed in a first housing;

the RF impedance measurement module and the fourth communications interface are enclosed in a second housing; and the first and second housing are independent from each and adapted for removal and replacement.

19. A method for processing semiconductor wafers within a plurality of plasma processing systems, comprising:
- providing a master plasma processing system comprising:
  - a master radio frequency (RF) power generator;
  - a master impedance matching unit having a first node coupled to the master RF power generator and a second node adapted for coupling to a master plasma processing chamber, the master impedance matching unit further comprises a master RF tuning circuit having adjustable tuning elements; and
  - communications interfaces coupled to the master RF power generator and the master impedance matching unit;
- providing a plurality of slave plasma processing systems, each one of the plurality of slave plasma processing systems comprises:
  - a slave RF power generator;
  - a slave impedance matching unit having a first node coupled to the slave RF power generator and a second node adapted for coupling to a slave plasma processing chamber, the slave impedance matching unit further comprises a slave RF tuning circuit having adjustable tuning elements; and
  - communications interfaces coupled to the slave RF power generator and the slave impedance matching unit;
- reading master power settings of the master RF power generator during a master plasma processing operation and communicating the master power settings to each of the slave RF power generators, wherein each of the slave RF power generators are configured to adjust their power setting based on the master power settings during slave plasma processing operations; and
- reading master position settings of the adjustable tuning elements of the master RF tuning circuit during the master plasma processing operation and communicating the master position settings to at least one of the slave impedance matching units, wherein each of the adjustable tuning elements of the slave impedance matching units are configured to adjust their adjustable tuning elements based on the position settings of the adjustable tuning elements of the master RF tuning circuit during slave plasma processing operations.

20. The method of claim 19, further comprising recording the master power settings and the master position settings of the adjustable tuning elements before communicating them to the slave RF power generators and the slave impedance matching units.

* * * * *